US006819173B2

(12) United States Patent
Louis et al.

(10) Patent No.: US 6,819,173 B2
(45) Date of Patent: Nov. 16, 2004

(54) METHOD AND APPARATUS FOR REDUCTION OF DISTORTION IN A TRANSMITTER

(75) Inventors: Edward Vincent Louis, St. Charles, IL (US); Michael David Leffel, Crystal Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 626 days.

(21) Appl. No.: 09/838,640

(22) Filed: Apr. 19, 2001

(65) Prior Publication Data

US 2002/0155821 A1 Oct. 24, 2002

(51) Int. Cl.[7] .................................................. H03F 1/26
(52) U.S. Cl. ...................................... 330/149; 330/151
(58) Field of Search ................................. 330/149, 151

(56) References Cited

U.S. PATENT DOCUMENTS

| | | | |
|---|---|---|---|
| 5,023,565 A | * 6/1991 | Lieu ............................ | 330/151 |
| 5,155,537 A | 10/1992 | Komatsu et al. | |
| 5,455,537 A | 10/1995 | Larkin et al. | |
| 5,831,479 A | 11/1998 | Leffel et al. ............ | 330/124 D |
| 5,874,856 A | 2/1999 | Van Horn ................... | 330/151 |
| 6,091,297 A | * 7/2000 | Bar-David et al. .......... | 330/149 |
| 6,104,241 A | * 8/2000 | Cova et al. .................. | 330/149 |
| 6,359,508 B1 | * 3/2002 | Mucenieks ................... | 330/149 |

OTHER PUBLICATIONS

James K. Cavers; "Adaptation Behavior of a Feedforward Amplifier Linearizer"; IEEE Transactions on Vehicular Technology, vol. 44, No. 1, Feb. 1995, pp. 31–39.

* cited by examiner

*Primary Examiner*—Khanh Van Nguyen
(74) *Attorney, Agent, or Firm*—Steven A. May (57) ABSTRACT

A transmitter that includes a feed forward amplifier amplifies an input signal to produce an amplified signal that includes a distortion component. The transmitter determines an error signal based on the input signal and the amplified signal and amplifies the error signal to produce an amplified error signal that includes an error signal distortion component. The transmitter combines the amplified error signal with the amplified signal to produce an output signal that includes the error signal distortion component and a portion of the amplified signal distortion component. The transmitter determines a distortion component of an attenuated version of the output signal and an energy of the determined distortion component. Based on the determined energy, the transmitter produces a control signal designed to minimize the energy of the distortion component of the attenuated output signal and thereby minimize distortion in the output signal.

17 Claims, 4 Drawing Sheets

METHOD AND APPARATUS FOR REDUCTION OF DISTORTION IN A TRANSMITTER

FIELD OF THE INVENTION

The present invention relates generally to wireless communication devices, and in particular to a transmitter portion of a wireless communication device.

BACKGROUND OF THE INVENTION

The frequency spectrum that is shared among radio communication devices is limited. Thus the ability of a transmitter to transmit as much information as possible in an allocated frequency spectrum or channel without interfering with other communication devices in adjacent channels is of great importance. To transmit as much information as possible in the allocated channel, digital communication systems typically modulate both the amplitude and phase of a radio frequency (RF) carrier. The amplitude modulation allows more information to be encoded on the carrier in a given channel than if only the phase was modulated. However, the amplitude modulation puts additional requirements on the transmitter that would not exist if only the phase of the RF carrier was modulated.

These additional requirements are due to the inherent nonlinear effects resulting from the amplification of an amplitude modulated signal by an RF power amplifier. Due to the nonlinear characteristics of the RF power amplifier, signal distortion components that include an amplitude component and a phase component are added to the original signal. These additional components are due to the amplitude compression characteristics (AM/AM) and the phase distortion (AM/PM) characteristics of the RF power amplifier when it is driven over a range of amplitudes. If these distortion components are not compensated they will cause spreading of the spectrum into the adjacent channels and thus interfere with communication devices using adjacent channels.

A number of prior art signal processing techniques have been developed to compensate for the nonlinear characteristics of RF power amplifiers. One such technique involves the use of a feed forward correction circuit in a feed forward amplifier. In general, feed forward amplifiers separate out distortion components generated by the RF power amplifier to create an error signal. The error signal is then amplified and added to the RF power amplifier's output with an amplitude, phase, and delay adjusted for maximum cancellation of the distortion components. However, the amount of distortion reduction available in a feed forward amplifier is limited by the distortion introduced into the error signal when the error signal is amplified by an error amplifier.

Figure 1:
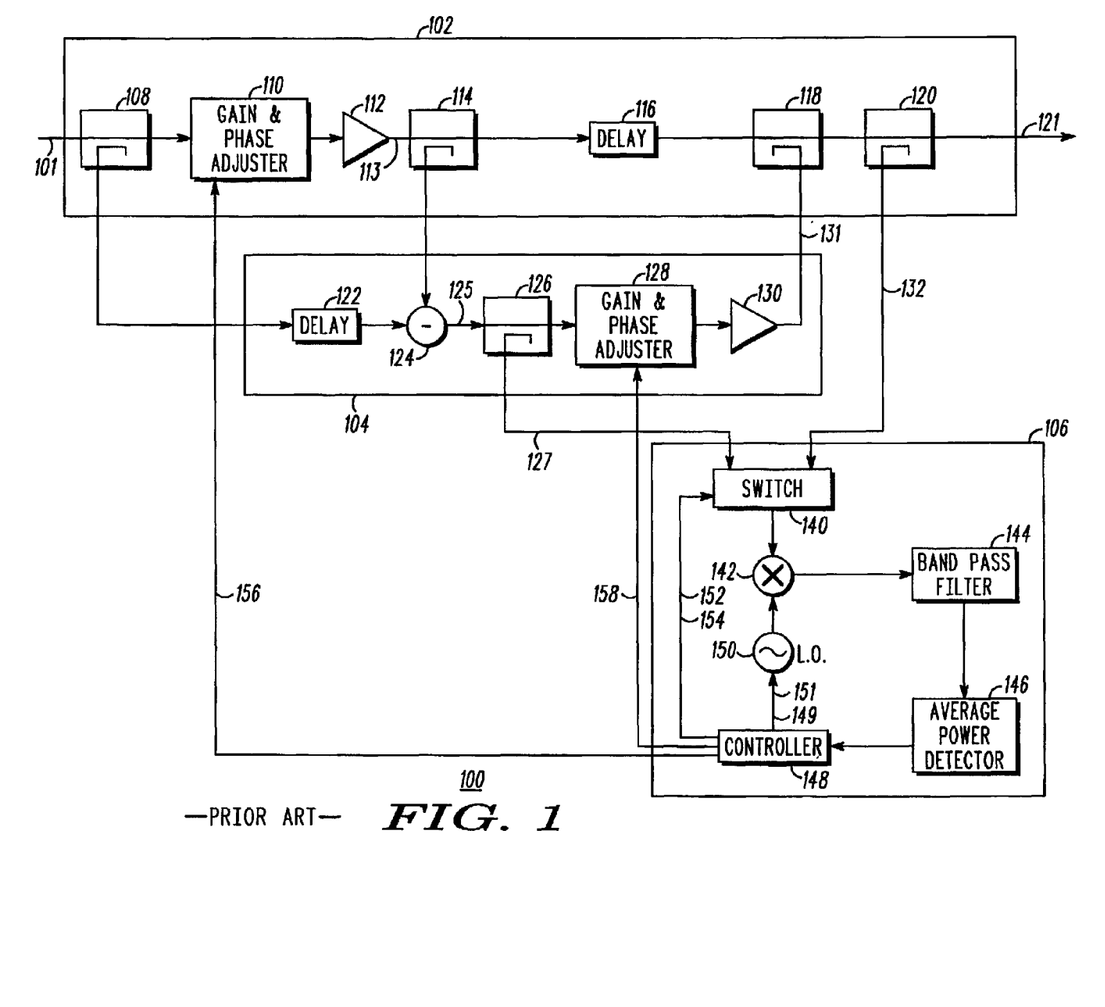
FIG. 1 is a block diagram of a feed forward amplifier of the prior art.

For example, FIG. 1 is a block diagram of an exemplary feed forward amplifier 100 of the prior art. Feed forward amplifier 100 includes a main signal path 102, a feed forward correction circuit 104, and a control circuit 106. An input signal 101 having carrier components is sourced to main signal path 102, where the signal is routed to a gain and phase adjuster 110 via an input signal coupler 108. Gain and phase adjuster 110 adjusts the amplitude and phase of input signal 101 based on a control signal received from control circuit 106. Gain and phase adjuster 110 conveys the amplitude and phase adjusted input signal to a radio frequency (RF) power amplifier 112 that amplifies the signal to produce an amplified signal 113. RF power amplifier 112 then conveys amplified signal 113 to a first output signal coupler 120 via a signal coupler 114 and a delay circuit 116. As mentioned above, RF power amplifier 112 introduces distortion components to the amplified signal, which distortion components are partially cancelled by an error signal output by feed forward correction circuit 104.

Feed forward correction circuit 104 produces the error signal based on input signal 101 and amplified signal 113. A summation junction 124 included in feed forward correction circuit 104 receives a portion of input signal 101 via input signal coupler 108 and delay circuit 122 and further receives a portion of amplified signal 113 via signal coupler 114. Summation junction 124 subtracts the received portion of the amplified signal from the received portion of the input signal to produce an error signal 125. The subtraction results in a partial cancellation of the carrier components of the received portion of amplified signal by the carrier components of the received portion of the input signal. As a result, error signal 125 primarily contains the distortion components of the received portion of the amplified signal.

Summation junction 124 conveys error signal 125 to a feed forward correction circuit error amplifier 130 via a feed forward signal coupler 126 and a feed forward gain and phase adjuster 128. Error amplifier 130 amplifies the received error signal to produce an amplified error signal 131 and conveys the amplified error signal to first output signal coupler 118. First output signal coupler 118 combines amplified error signal 131 with amplified signal 113 to partially cancel the distortion components of amplified signal 113 and produce a distortion reduced output signal 121.

Amplification of error signal 125 by error amplifier 130 may result in an introduction of distortion components to the error signal due to the amplitude compression and the phase distortion characteristics of the error amplifier. Since amplified error signal 131 is combined with amplified signal 113 at output signal coupler 120, it is desirable to minimize the added distortion. In order to reduce the distortion introduced into amplified error signal 131 by error amplifier 130, control circuit 106 controls an average power of an error amplifier drive signal, that is, error signal 125.

Control circuit 106 receives a portion of error signal 125, that is, attenuated error signal 127, from feed forward signal coupler 126. Control circuit 106 further receives a portion of output signal 121, that is, attenuated output signal 132, from a second main signal path output signal coupler 120 that receives output signal 121 from first main signal path output signal coupler 118. Control circuit 106 routes each of attenuated error signal 127 and attenuated output signal 132 to a switch 140, typically a multiplexer.

Switch 140 is controlled by a controller 148 coupled to the switch. When switch 140 receives a first switch control signal 152 from controller 148, the switch routes attenuated error signal 127 to a mixer 142. A local oscillator 150 coupled to mixer 142 and controller 148 sources a reference signal to the mixer. In response to a first local oscillator control signal 149 sourced by controller 148 to local oscillator 150, the local oscillator adjusts a frequency of the reference signal such that mixer 142 downconverts attenuated error signal 127 to baseband to produce a baseband error signal. Mixer 142 then conveys the baseband error signal to an average power detector 146 via a band pass filter 144 coupled to the mixer. Average power detector 146 determines an average power of the baseband error signal. Controller 148 reads the average power determined by average power detector 146 and, based on the average power, conveys a control signal 156 to gain and phase adjuster 110 that is designed to minimize the average power of the baseband error signal. In response to receiving control signal 156, gain and phase adjuster 110 adjusts an amplitude and phase of input signal 101, thereby adjusting an average power of error signal 125 and adjusting the average power of the baseband error signal.

When switch 140 receives a second switch control signal 154 from controller 148, the switch routes attenuated output signal 132 to mixer 142. When attenuated output signal 132 is routed to mixer 142, controller 148 sources a second local oscillator control signal 151 to local oscillator 150. In response to the second local oscillator control signal 151, local oscillator 150 adjusts the frequency of the reference signal such that mixer 142 downconverts attenuated output signal 132 to baseband to produce a baseband output signal. Mixer 142 then conveys the baseband output signal to average power detector 146 via band pass filter 144. Average power detector 146 determines an average power of the baseband output signal. Controller 148 reads the average power determined by detector 146 and, based on the average power, conveys a control signal 158 to feed forward correction circuit gain and phase adjuster 128 that is designed to minimize the average power of the baseband output signal. In response to receiving control signal 158, gain and phase adjuster 128 adjusts an amplitude and phase of error signal 125, thereby i) adjusting an average power of error signal 125 and the cancellation the distortion components of amplified signal 113 by amplified error signal 131, ii) reducing the distortion components of output signal 121, and iii) adjusting the average power of the baseband error signal.

Control of an average power of error signal 125 does not necessarily minimize the distortion introduced into the amplified error signal by error amplifier 130, and therefore does not necessarily minimize the distortion included in output signal 121. By controlling the average power of the error amplifier drive signal, the prior art provides suboptimal reduction of distortion introduced by feed forward correction circuit 104 as the prior art fails to minimize the peak power of the error amplifier drive signal, which is based on error signal 125, and the distortion introduced into an amplified error signal by the peak power of the error signal.

Therefore a need exists for a method and apparatus for minimizing the distortion introduced into a feed forward amplifier by the feed forward correction circuit.

DESCRIPTION OF A PREFERRED EMBODIMENT

To address the need for a method and apparatus for minimizing the distortion introduced into a feed forward amplifier by the feed forward correction circuit, a transmitter of a communication device includes a feed forward amplifier having a main signal path, a feed forward correction circuit, and a control circuit. A signal input into the main signal path is amplified to produce an amplified signal that includes a distortion component. Based on the input signal and the amplified signal, the feed forward correction circuit produces and amplifies an error signal to produce an amplified error signal that includes an error signal distortion component. The transmitter then combines the amplified error signal with the amplified signal to produce a transmitter output signal that includes a portion of the amplified signal distortion component and the error signal distortion component. In order to reduce the distortion components of the transmitter output signal, at least a portion of the transmitter output signal is conveyed to the control circuit. The control circuit determines a distortion component of the at least a portion of the transmitter output signal. Based on an energy of the determined distortion component, the control circuit produces a control signal designed to minimize the energy of the distortion component of the at least a portion of the transmitter output signal, and thereby minimize distortion in the transmitter output signal.

Generally, the present invention encompasses an apparatus for correcting distortion in a feed forward amplifier. The feed forward amplifier receives an input signal and amplifies the input signal to produce an amplified signal. The feed forward amplifier determines an error signal based on the input signal and the amplified signal and amplifies the error signal to produce an amplified error signal. The feed forward amplifier combines the amplified signal and the amplified error signal to produce a feed forward amplifier output signal that comprises a carrier component and a distortion component. The apparatus reduces the distortion component of the feed forward amplifier output signal and includes a control circuit that receives a portion of the feed forward amplifier output signal, determines a distortion component of the portion of the feed forward amplifier output signal, and produces a control signal based on an energy of the distortion component of the portion of the feed forward amplifier output signal. The control signal is capable of controlling the peak power of the error signal, and, by controlling the peak power of the error signal, reducing an energy of the distortion component of the feed forward amplifier output signal.

Another embodiment of the present invention encompasses a communication device having a transmitter. The transmitter includes a main signal path, a feed forward correction circuit coupled to main signal path, and a control circuit coupled to the main signal path. The main signal path receives an input signal, amplifies the input signal to produce an amplified signal, receives an amplified error signal, combines the amplified signal with the amplified error signal to produce a feed forward amplifier output signal, conveys a portion of the feed forward amplifier output signal to a control circuit, and wherein the feed forward amplifier output signal comprises a carrier component and a distortion component. The feed forward correction circuit receives at least a portion of the input signal and at least a portion of the amplified signal, produces an error signal based on the received portions of the input signal and the amplified signal, amplifies the error signal to produce the amplified error signal, and conveys the amplified error signal to the main signal path. The control circuit receives a portion of the feed forward amplifier output signal, determines a distortion component of the portion of the feed forward amplifier output signal, produces a control signal based on an energy of the distortion component of the portion of the feed forward amplifier output signal, and conveys the control signal to the main signal path. The main signal path further adjusts an amplitude of the input signal based on the control signal in order to minimize the energy of the distortion component of the feed forward amplifier output signal.

Yet another embodiment of the present invention provides a method for reducing distortion in a transmitter that amplifies an input signal to produce an amplified signal. The method includes steps of sampling the input signal to produce an attenuated input signal and sampling the amplified signal to produce an attenuated amplified signal. The method further includes steps of combining the attenuated input signal with the attenuated amplified signal to produce an error signal, amplifying the error signal to produce an amplified error signal, and combining the amplified error signal with the amplified signal to produce a transmitter output signal that comprises a carrier component and a distortion component. The method further includes steps of sampling the transmitter output signal to produce an attenuated output signal, determining a distortion component of the attenuated output signal, and determining an energy of the distortion component of the attenuated output signal. The method further includes a step of producing a control signal based on determined energy, wherein the control signal is capable of reducing the distortion component of the attenuated output signal, and wherein reduction of the distortion component of the attenuated output signal corresponds to a reduction of the distortion component of the transmitter output signal.

Figure 2:
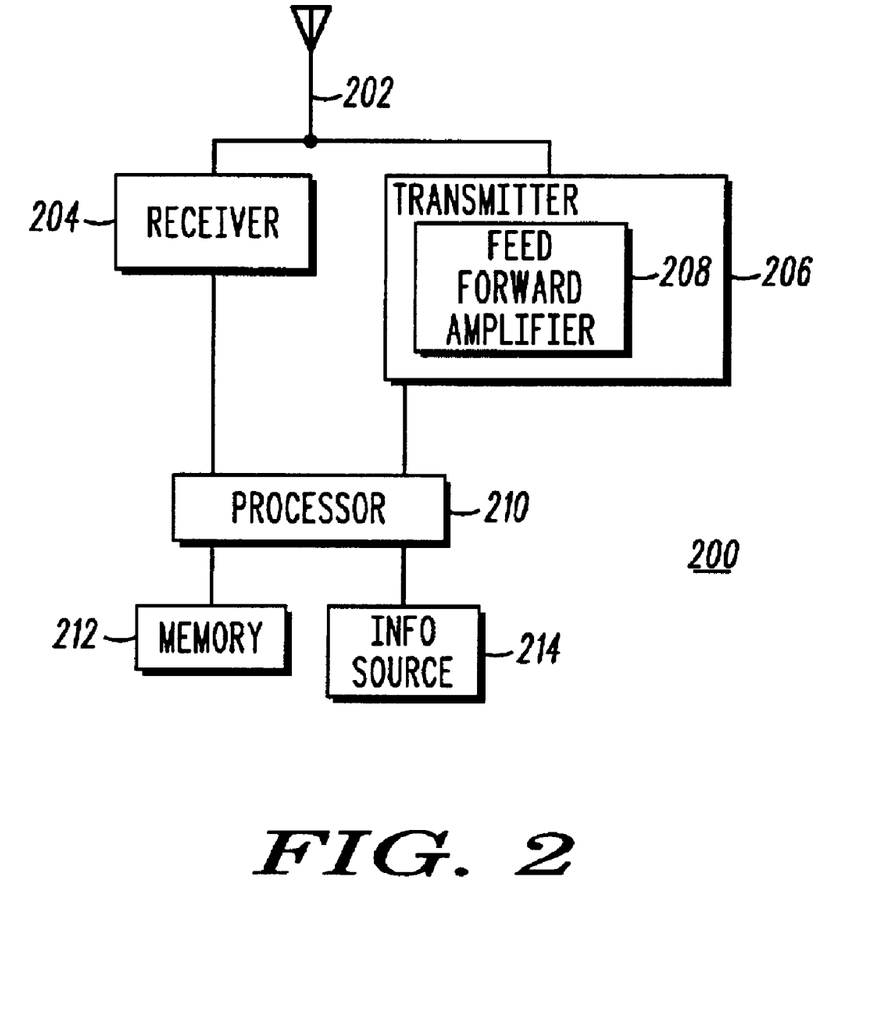
FIG. 2 is a block diagram of a communication device in accordance with an embodiment of the present invention.

The present invention may be more fully described with reference to FIGS. 2–4. FIG. 2 is a block diagram of a communication device 200 in accordance with an embodiment of the present invention. Preferably, communication device 200 includes a base transceiver station; however, alternatively communication device 100 may include any wireless communication device capable of wirelessly transmitting information, such as a cellular telephone, a radiotelephone, or a wireless modem. Communication device 200 includes an antenna 202 coupled to each of a receiver 204 and a transmitter 206 having a feed forward amplifier 208. Communication device 200 further includes a processor 210, such as a microprocessor or a digital signal processor (DSP), coupled to each of receiver 204 and transmitter 206 and further coupled to a memory 212 and an information source 214. Memory 212 stores programs executed by processor 210 in the operation of communication device 200. Information source 214 can include an interface with devices or networks external to communication device 200, or alternatively, in the case of a cellular telephone or a radiotelephone, may be a user interface, or in another alternative embodiment may be included in processor 210 and may be an application running on the processor.

Information source 214 or receiver 204 sources information to processor 210. Processor 210 processes the information in accordance with well-known signal processing techniques and then conveys a signal comprising the processed information to transmitter 206. Transmitter 206 modulates the information onto a radio frequency (RF) carrier to produce an RF signal and routes the RF signal to feed forward amplifier 208, which amplifies the signal for transmission via antenna 202.

Figure 3:
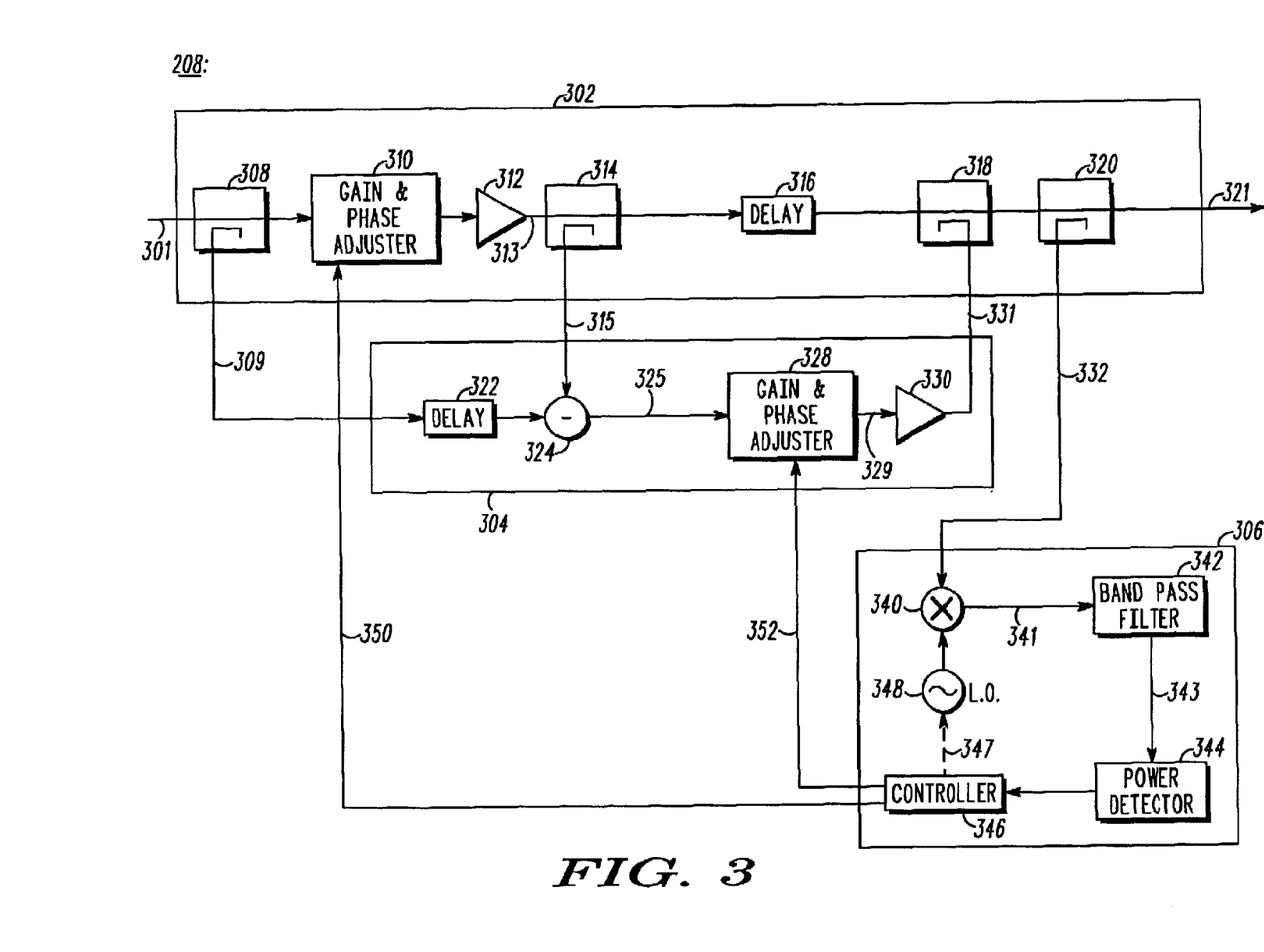
FIG. 3 is a block diagram of a feed forward amplifier in accordance with an embodiment of the present invention.

FIG. 3 is a block diagram of feed forward amplifier 208 in accordance with an embodiment of the present invention. Feed forward amplifier 208 includes a main signal path 302 that is coupled to each of a feed forward correction circuit 304 and a control circuit 306. An RF signal 301 comprising carrier components is input into feed forward amplifier 208. Feed forward amplifier 208 routes input signal 301 to main signal path 302, where the input signal is conveyed to a gain and phase adjuster 310 via an input signal coupler 308, preferably a directional coupler. Gain and phase adjuster 310 adjusts the amplitude and phase of input signal 301 based on a control signal received from control circuit 306. Gain and phase adjuster 310 then conveys the amplitude and phase adjusted input signal to an RF power amplifier 312 coupled to gain and phase adjuster 310. RF power amplifier 312 includes an RF amplifying element such as a power transistor, input and output matching networks, and biasing and decoupling circuitry as are necessary to allow the functionality of the RF amplifying element and to bias the RF amplifying element class AB; however, those of ordinary skill in the art will realize that other biases, such as classes B or C, might be used here without departing from the spirit and scope of the present invention.

RF power amplifier 312 amplifies the amplitude and phase adjusted input signal to produce an amplified signal 313 that includes amplified carrier components and further includes distortion components introduced into the amplified signal by the power amplifier. The distortion components are due to the amplitude compression characteristics and the phase distortion characteristics of RF power amplifier 312 when the power amplifier is driven over a range of amplitudes, and if not compensated may cause spreading of the spectrum into the adjacent channels and thus interfere with communication devices using adjacent channels. RF power amplifier 312 then conveys amplified signal 313 to a first output signal coupler 318, preferably a directional coupler, via a signal coupler 314, preferably a directional coupler, coupled to the power amplifier, and a delay circuit 316 coupled to each of signal couplers 314 and 318. Each of signal couplers 308, 314, and 318 are further coupled to feed forward correction circuit 304.

In order to cancel the distortion components of amplified signal 313, feed forward correction circuit 304 produces an error signal based on input signal 301 and amplified signal 313. Input signal coupler 308 samples input signal 301 to produce an attenuated input signal 309 and conveys the attenuated input signal to a summation junction 324 included in feed forward correction circuit 304 via a delay circuit 322. A time delay of delay circuit 322 is set to compensate for a signal delay through gain and phase adjuster 310, amplifier 312, and signal coupler 314. Signal coupler 314 samples amplified signal 313 to produce attenuated amplified signal 315 and conveys attenuated amplified signal 315 to summation junction 324

Summation junction 324 receives each of attenuated amplified signal 315 and delayed attenuated input signal 309 and combines the two signals, preferably subtracting signal 315 from signal 309, to produce an error signal 325. The subtraction of attenuated amplified signal 315 from the delayed attenuated input signal 309 results in a partial cancellation of the carrier components of attenuated amplified signal 315 by the carrier components of attenuated input signal 309. As a result, error signal 325 primarily contains the distortion components of attenuated amplified signal 315, which correspond to the distortion components of amplified signal 313.

Error signal 325 is then amplified and combined with amplified signal 313 for reduction of the distortion components of the amplified signal 313. Summation junction 324 conveys error signal 325 to an error amplifier 330 via a feed forward gain and phase adjuster 328 coupled to each of the summation junction and the error amplifier. In response to a control signal received from control circuit 306, feed forward gain and phase adjuster 328 adjusts an amplitude of error signal 325 and a phase of the error signal to produce an amplitude and phase adjusted error signal 329. The amplitude and phase adjustments of error signal 325 are designed to facilitate maximum cancellation of the distortion components of amplified signal 313 at first output signal coupler 318. Gain and phase adjuster 328 conveys adjusted error signal 329 to error amplifier 330, and the error amplifier amplifies error signal 329 to produce an amplified error signal 331. Amplified error signal 331 includes an error component corresponding to an amplified version of error signal 325 and may further include error signal distortion components that are introduced to the amplified error signal due to non-linear characteristics of the error amplifier.

Error amplifier 330 then conveys amplified error signal 331 to first output signal coupler 318. First output signal coupler 318 combines amplified error signal 331 and amplified signal 313, preferably subtracting the former from the latter, to cancel the distortion components of amplified signal 313 and to produce a distortion reduced output signal 321. Prior to subtraction, amplified signal 313 is time delayed via delay circuit 316. A time delay of delay circuit 316 is set to compensate for a signal delay through signal coupler 314, summation junction 324, gain and phase adjuster 328, and error amplifier 330.

Since amplified error signal 331 is combined with amplified signal 313 at output signal coupler 318 to produce output signal 321, output signal 321 may include the amplified carrier components, the distortion components introduced into the amplified signal by the power amplifier and not cancelled by the amplified error signal, and the error signal distortion components introduced into the amplified error signal by the error amplifier. Since it is desirable to minimize all distortion components of output signal 321, it is desirable to maximize the cancellation of the distortion components of amplified signal 313 and to minimize the error signal distortion components.

The prior art reduces distortion introduced into an amplified error signal by controlling an average power of the error signal and the corresponding error amplifier drive signal. However, control of an average power of an error signal does not assure that the peak power of the error amplifier drive signal, which drives the error amplifier furthest into gain compression resulting in the most severe AM/AM and AM/PM distortion, is minimized. In order to optimally reduce the distortion introduced into amplified error signal 331, control circuit 306 of feed forward amplifier 208 controls the cancellation of the distortion components of amplified signal 313 and further controls the distortion introduced into amplified error signal 331 by error amplifier 330. By controlling the distortion introduced into amplified error signal 331, the distortion introduced into feed forward amplifier output signal 321 by the amplified error signal can be reduced.

Control circuit 306 includes a mixer 340 that is coupled to each of a band pass filter 342 and a local oscillator 348, a detector 344 coupled to the band pass filter, and a controller 346 coupled to the detector. Control circuit 306 produces multiple control signals 350, 352, based on the distortion components of transmitter output signal 321, which control signals function to reduce the distortion components of the transmitter output signal.

A second main signal path output signal coupler 320, preferably a directional coupler, receives transmitter output signal 321 from first main signal path output signal coupler 318. Signal coupler 320 samples transmitter output signal 321 to produce attenuated output signal 332 and conveys the attenuated output signal to control circuit 306. Control circuit 306 routes attenuated output signal 332 to mixer 340.

Local oscillator 348 sources a reference signal to mixer 340. Preferably a frequency of the reference signal is approximately the same as a frequency of output signal 321. Mixer 340 multiplies the reference signal and attenuated output signal 332 to produce a baseband output signal 341 and conveys the baseband output signal to band pass filter 342. In another embodiment of the present invention, the frequency of the reference signal may be adjusted based on a control signal sourced by controller 346. Local oscillator 348, for example a voltage controlled oscillator (VCO), is coupled to controller 346 and is sourced a control signal 347 by the controller. In response to receiving the control signal, local oscillator 348 adjusts the frequency of the reference signal to an appropriate frequency so that mixer 340 downconverts attenuated output signal 332 to baseband to produce baseband output signal 341.

Band pass filter 342 receives baseband output signal 341 and filters out any remaining aspects of the carrier components, producing a residual distortion signal 343. Residual distortion signal 343 primarily includes the distortion components introduced into amplified signal 313 by RF power amplifier 312 and not cancelled by amplified error signal 331 and the error signal distortion components introduced into amplified error signal 331 by error amplifier 330. Band pass filter 342 then conveys residual distortion signal 343 to detector 344. Detector 344 determines an energy of residual distortion signal 343. Controller 346 reads the energy determined by detector 344 and, based on the energy, conveys a first control signal 350 to main signal path gain and phase adjuster 310 and a second control signal 352 to feed forward gain and phase adjuster 328.

In response to receiving control signal 350, gain and phase adjuster 310 adjusts an amplitude and a phase of input signal 301 such that an energy of a peak power of error signal 325 is minimized, correspondingly minimizing the error amplifier 330 drive signal and concomitantly minimizing an energy of the error signal distortion components introduced into amplified error signal 331 by error amplifier 330 and into output signal 321 by amplified error signal 331. In response to receiving control signal 352, gain and phase adjuster 328 adjusts an amplitude and a phase of error signal 325 so as to maximize cancellation of the distortion components of amplified signal 313 by amplified error signal 331 at first output signal coupler 318, and thereby further reduce the energy of the distortion components of output signal 321.

By reducing the energy of the distortion components of transmitter output signal 321, communication device 200 transmits a more linear transmitter output signal and minimizes a problem of adjacent channel coupled power (ACCP) due to the non-linearities of feed forward amplifier 208. Communication device 200 reduces the energy of the distortion components of output signal 321 by maximizing the cancellation of the distortion components in amplified signal 313 by amplified error signal 331. In order to maximize the cancellation of the distortion components in amplified signal 313, feed forward correction circuit 304 of communication device 200 adjusts an amplitude and a phase of error signal 325, which error signal is amplified to produce amplified error signal 331. The amplitude and phase of error signal 325 is adjusted based on a control signal 352 provided to feed forward correction circuit 304 by control circuit 306, which control signal is in turn based on a detected energy of a distortion component of attenuated transmitter output signal 332 that is coupled to control circuit 306. Maximum cancellation of the distortion components in amplified signal 313 is then achieved by minimizing the energy of the distortion component of attenuated transmitter output signal 332.

Communication device 200 further reduces the energy of the distortion components of output signal 321 by minimizing any error signal distortion components included in amplified error signal 331. Error signal distortion components are introduced to amplified error signal 331 due to the non-linearities of error amplifier 330. In order to minimize the error signal distortion components introduced to amplified error signal 331, communication device 200 controls a peak power of error signal 325, which error signal is used to drive error amplifier 330 in feed forward correction circuit 304. In order to control the peak power of error signal 325, main signal path 302 of communication device 200 adjusts an amplitude and a phase of input signal 301, which adjusted input signal is then amplified by RF power amplifier 312 to produce amplified signal 313. Feed forward correction circuit 304 then combines a portion of input signal 301 (i.e., signal 309) with a portion of amplified signal 313 (i.e., signal 315) to produce error signal 325.

By adjusting an amplitude and a phase of input signal 301, communication device 200 can maximize a cancellation of carrier components of signal 309 with carrier components of signal 315, thereby reducing the peak power of the error amplifier drive signal. Furthermore, by adjusting an amplitude and a phase of input signal 301, communication device 200 controls an amplitude and a phase of a drive signal applied to RF power amplifier 312 (i.e., the amplitude and phase adjusted input signal) and can control the distortion introduced into amplified signal 313 by RF power amplifier 312, thereby further reducing the peak power of the error amplifier drive signal. The amplitude and phase of input signal 301 is adjusted based on a control signal 350 provided to feed forward correction circuit 304 by control circuit 306, which control signal is in turn based on a detected energy of a distortion component of attenuated transmitter output signal 332 that is coupled to control circuit 306. Reduction of the peak power of error signal 325 is then achieved by minimizing the energy of the distortion component of the coupled attenuated transmitter output signal.

Furthermore, communication device 200 achieves reduced distortion in transmitter output signal 321 relative to the prior art at a reduced transmitter cost and complexity. Communication device 200 does not require a control circuit switch, such as switch 140, of prior art feed forward amplifier 100, and by eliminating the switch eliminates the need for control of the switch by a controller. Furthermore, control circuit 306 receives only a portion of transmitter output signal 321, as opposed to control circuit 106 of prior art feed forward amplifier 100 also receiving a portion of error signal 125, and therefore has a reduced need for an adjustment of a frequency of a reference signal sourced by local oscillator 348.

Figure 4:
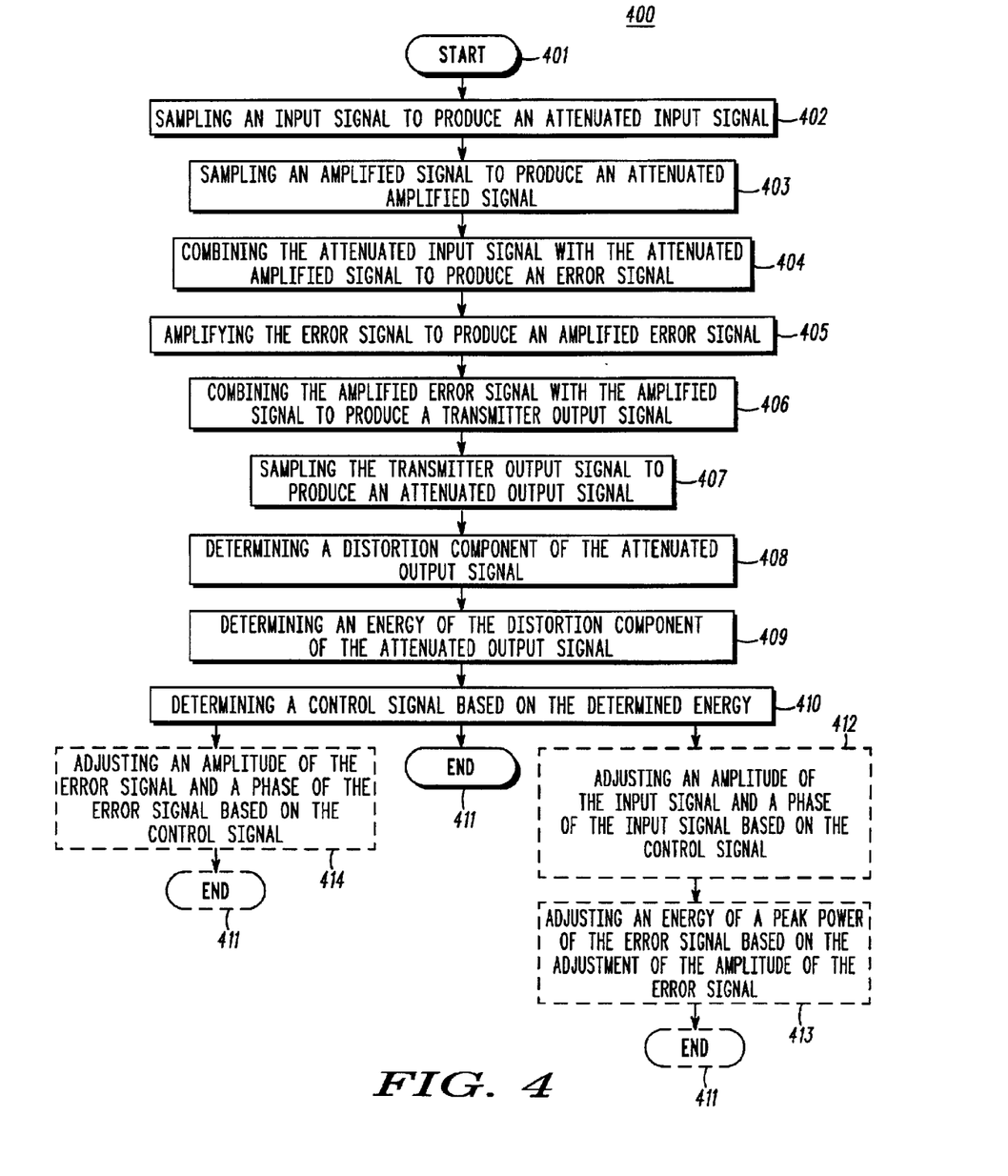
FIG. 4 is a logic flow diagram of steps executed by a transmitter to reduce distortion in accordance with an embodiment of the present invention.

FIG. 4 is a logic flow diagram 400 of steps executed by transmitter 206 in order to reduce distortion in accordance with an embodiment of the present invention. As described above, the transmitter preferably includes a main signal path 302 coupled to a feed forward correction circuit 304 and further coupled to a control circuit 306. The transmitter receives an input signal that includes a carrier component and routes the input signal to the main signal path, where the input signal is amplified. Amplification of the input signal produces an amplified signal that includes an amplified carrier component and a distortion component. The main signal path also conveys a portion of the input signal and a portion of the amplified signal to the feed forward correction circuit. The logic flow begins (401) when the transmitter, preferably a first signal coupler included in the main signal path, samples (402) the input signal to produce an attenuated input signal and conveys the attenuated input signal to the feed forward correction circuit. The transmitter, preferably a second signal coupler included in the main signal path, samples (403) the amplified signal to produce an attenuated amplified signal and conveys the attenuated amplified signal to the feed forward correction circuit.

The transmitter, preferably the feed forward correction circuit, then combines (404) the attenuated input signal with the attenuated amplified signal to produce an error signal. The combining of the attenuated input signal with the attenuated amplified signal partially cancels a carrier component of the attenuated amplified signal, producing an error signal that primarily includes a distortion component of the attenuated amplified signal.

The transmitter, preferably the feed forward correction circuit, amplifies (405) the error signal to produce an amplified error signal. The amplified error signal is conveyed by the feed forward correction circuit to the main signal path. The transmitter, preferably the main signal path, combines (406) the amplified error signal with the amplified signal in order to produce a transmitter output signal. The combining (406) of the amplified error signal with the amplified signal also produces a partial cancellation of the distortion component of the amplified signal. Ideally, the transmitter output signal includes a clean carrier component, but the cancellation of the distortion component of the amplified signal by the amplified error signal is less than perfect so the transmitter output signal further includes a distortion component. Furthermore, amplification of the error signal introduces error signal distortion components into the amplified error signal, which error signal distortion components are included in the transmitter output signal when the amplified error signal is combined with the amplified signal.

The transmitter, preferably a third signal coupler included in the main signal path, then samples (407) the transmitter output signal to produce an attenuated output signal and conveys the attenuated output signal to the control circuit. The transmitter, preferably the control circuit, determines (408) a distortion component of the attenuated output signal and further determines (409) an energy of the distortion component of the attenuated output signal. The transmitter, preferably the control circuit, produces (410) a control signal based on determined energy, wherein the control signal is capable of reducing the energy of the distortion component of the attenuated output signal, and in doing so reduces distortion in the transmitter output signal, and the logic flow ends (411).

In another embodiment of the present invention, the control circuit conveys the control signal to the main signal path. The logic flow diagram 400 then further includes a step of the transmitter, preferably a gain and phase adjuster included in the main signal path, adjusting (412) an amplitude of the input signal and a phase of the input signal based on the control signal.

In yet another embodiment of the present invention, the adjustment of the amplitude and the phase of the input signal (step 412) produces a corresponding adjustment of an amplitude and a phase of the attenuated input signal conveyed by the mains signal path to the feed forward correction circuit. In response to the adjustment of the amplitude and the phase of the input signal, the transmitter further executes a step of adjusting (413) an energy of a peak power of the error signal based on the adjustment of the amplitude of the input signal. By adjusting an energy of the peak power of the error signal, the transmitter minimizes a drive signal of an error amplifier included in the feed forward correction circuit, which error amplifier produces the amplified error signal based on the error signal. By minimizing the drive signal of the error amplifier, the transmitter concomitantly minimizes an energy of the error signal distortion components introduced into the amplified error signal by the error amplifier and thereby reduces distortion in the transmitter output signal.

In still another embodiment of the present invention, the control circuit conveys the control signal to the feed forward correction circuit. The logic flow diagram 400 then further includes a step of the transmitter, preferably a gain and phase adjuster included in the feed forward correction circuit, adjusting (414) an amplitude of the error signal and a phase of the error signal based on the control signal, thereby maximizing cancellation of the distortion component of the amplified signal by the amplified error signal in the main signal path and further reducing distortion in the transmitter output signal.

In sum, a communication device having a transmitter that includes a main signal path, a feed forward correction circuit, and a control circuit reduces distortion in a transmitter output signal by generating one or more control signals that are based on distortion included in an attenuated version of the transmitter output signal. The one or more control signals are used to adjust an amplitude and a phase of an input signal, an amplitude and a phase of an error signal, or an amplitude and a phase of each of an input signal and an error signal. By adjusting an amplitude and a phase of the input signal, a peak power of the error signal can be minimized, correspondingly minimizing an energy of the error signal distortion component introduced into an amplified error signal by an error amplifier and into the transmitter output signal by the amplified error signal. By adjusting an amplitude and a phase of the error signal, a cancellation of the distortion components of the amplified signal by the amplified error signal can be maximized, correspondingly reducing the energy of the distortion components of the transmitter output signal.

While the present invention has been particularly shown and described with reference to particular embodiments thereof, it will be understood by those skilled in the art that various changes may be made and equivalents substituted for elements thereof without departing from the spirit and scope of the invention. In addition, many modifications may be made to adapt a particular situation or material to the teachings of the invention without departing from the essential scope thereof. Therefore, it is intended that the invention not be limited to the particular embodiments disclosed herein, but that the invention will include all embodiments falling within the scope of the appended claims.

What is claimed is:

1. In a feed forward amplifier that receives an input signal and amplifies the input signal to produce an amplified signal, wherein the feed forward amplifier determines an error signal based on the input signal and the amplified signal, wherein the feed forward amplifier amplifies the error signal to produce an amplified error signal, and wherein the feed forward amplifier combines the amplified signal and the amplified error signal to produce an output signal that comprises a carrier component and a distortion component, an apparatus for correcting distortion in the feed forward amplifier comprising:

a control circuit comprising:
a mixer that receives a portion of the feed forward amplifier output signal and downconverts the feed forward amplifier output signal to baseband to produce a baseband output signal;
a filter that receives the baseband output signal and filters the baseband output signal to produce a distortion signal comprising the distortion components;
a detector that detects an energy of the distortion signal;
a controller coupled to the detector that produces a control signal based on the detected energy; and
wherein the control signal is capable of controlling the peak power of the error signal, and, by controlling the peak power of the error signal, reducing an energy of the distortion component of the feed forward amplifier output signal.

2. The apparatus of claim 1, wherein the control circuit further detects an energy of a distortion components and produces the control signal based on the detected energy.

3. The apparatus of claim 1, wherein the control circuit further comprises a local oscillator coupled to the mixer that produces a reference signal and conveys the reference signal to the mixer, and wherein the mixer multiplies the feed forward amplifier output signal with the reference signal to produce a baseband output signal.

4. The apparatus of claim 3, wherein the local oscillator is further coupled to the controller, wherein the controller produces a local oscillator control signal that the controller conveys to the local oscillator, and wherein the local oscillator produces the reference signal based on the local oscillator control signal.

5. The apparatus of claim 1, wherein the control signal is capable of controlling an adjustment of an amplitude of the input signal and a phase of the input signal.

6. The apparatus of claim 1, wherein the control signal is capable of controlling an amplitude of the error signal and a phase of the error signal.

7. A communication device having a transmitter that comprises:

a main signal path that receives an input signal, samples the input signal to produce an attenuated input signal, conveys the attenuated input signal to a feed forward correction circuit, amplifies the input signal to produce an amplified signal, samples the amplified signal to produce an attenuated amplified signal, conveys the attenuated amplified signal to the feed forward correction circuit, receives an amplified error signal, combines the amplified signal with the amplified error signal to produce a transmitter output signal that comprises a carrier component and a distortion component, samples the transmitter output signal to produce an attenuated output signal, and conveys the attenuated output signal to a control circuit;

a feed forward correction circuit coupled to main signal path that receives the attenuated input signal and the attenuated amplified signal, produces an error signal based on the attenuated input signal and the attenuated amplified signal, amplifies the error signal to produce the amplified error signal, conveys the amplified error signal to the main signal path;

a control circuit coupled to main signal path that comprises:
a mixer that receives the attenuated output signal and downconverts the attenuated output signal to baseband to produce a baseband output signal;
a filter that receives the baseband output signal and filters the baseband output signal to produce a distortion signal comprising the distortion components;
a detector that detects an energy of the distortion signal;
a controller coupled to the detector that produces the control signal based on the detected energy; and
wherein the control signal reduces the distortion component of the attenuated output signal and wherein reduction of the distortion component of the attenuated output signal corresponds to a reduction of the distortion component of the transmitter output signal.

8. The apparatus of claim 7, wherein the control circuit further detects an energy of the distortion component and produces the control signal based on the detected energy.

9. The apparatus of claim 7, wherein the control circuit further comprises a local oscillator coupled to the mixer that produces a reference signal and conveys the reference signal to the mixer, and wherein the mixer multiplies the feed forward amplifier output signal with the reference signal to produce a baseband output signal.

10. The apparatus of claim 9, wherein the local oscillator is further coupled to the controller, wherein the controller produces a local oscillator control signal that the controller conveys to the local oscillator, and wherein the local oscillator produces the reference signal based on the local oscillator control signal.

11. The communication device of claim 7, wherein the control circuit conveys the control signal to the main signal path and wherein the main signal path adjusts an amplitude of the input signal based on the control signal.

12. The method of claim 11, wherein the feed forward correction circuit adjusts an energy of a peak power of the error signal based on the adjustment of an amplitude of the input signal.

13. The communication device of claim 7, wherein the control circuit conveys the control signal to the feed forward correction circuit and wherein the feed forward correction circuit adjusts an amplitude of the error signal and a phase of the error signal based on the control signal.

14. A method for reducing distortion in a transmitter that amplifies an input signal to produce an amplified signal, the method comprising steps of:

sampling the input signal to produce an attenuated input signal;

sampling the amplified signal to produce an attenuated amplified signal;

combining the attenuated input signal with the attenuated amplified signal to produce an error signal;

amplifying the error signal to produce an amplified error signal;

combining the amplified error signal with the amplified signal to produce a transmitter output signal that comprises a carrier component and a distortion component;

sampling the transmitter output signal to produce an attenuated output signal;

downconverting the attenuated output signal to baseband to produce a baseband output signal;

filtering the baseband output signal to produce a distortion signal comprising a distortion component of the baseband output signal;

determining an energy of the distortion component of the baseband output signal; and producing a control signal based on determined energy, wherein the control signal is capable of reducing the distortion component of the attenuated output signal, and wherein reduction of the distortion component of the attenuated output signal corresponds to a reduction of the distortion component of the transmitter output signal.

15. The method of claim 14, further comprising a step of adjusting an amplitude of the input signal and a phase of the input signal based on the control signal.

16. The method of claim 15, further comprising a step of adjusting an energy of a peak power of the error signal based on the adjustment of an amplitude of the input signal.

17. The method of claim 14, further comprising a step of adjusting an amplitude of the error signal and a phase of the error signal based on the control signal.

* * * * *